(12) United States Patent
Lewis

(10) Patent No.: US 11,547,010 B2
(45) Date of Patent: Jan. 3, 2023

(54) LATCHING MECHANISM

(71) Applicant: EMC IP Holding Company LLC, Hopkinton, MA (US)

(72) Inventor: Jeffrey Michael Lewis, Maynard, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 333 days.

(21) Appl. No.: 16/881,130

(22) Filed: May 22, 2020

(65) Prior Publication Data

US 2021/0364021 A1    Nov. 25, 2021

(51) Int. Cl.
*H05K 7/14*    (2006.01)
*F16B 5/06*    (2006.01)
*F16B 1/04*    (2006.01)

(52) U.S. Cl.
CPC ............. *H05K 7/1402* (2013.01); *F16B 1/04* (2013.01); *F16B 5/0621* (2013.01)

(58) Field of Classification Search
CPC ...... H05K 7/1402; H05K 7/1409; F16B 1/04; F16B 5/0621
See application file for complete search history.

(56) References Cited

U.S. PATENT DOCUMENTS

2012/0235002 A1*    9/2012    Zhang ................. G06F 1/187
                                                              248/309.1

* cited by examiner

*Primary Examiner* — James Wu
*Assistant Examiner* — Hung Q Dang
(74) *Attorney, Agent, or Firm* — Muirhead and Saturnelli, LLC

(57) ABSTRACT

A latching mechanism includes a body having a trip-latch with a protruding portion that protrudes from the body, a release button coupled to a release shaft disposed inside the body, and a holding edge disposed on the release shaft. The holding edge engages the trip-latch to maintain the release button in a depressed position. The holding edge disengages the trip-latch to place the release button in a non-depressed position in response to urging the protruding portion of the trip latch toward the rotatable body. The latching mechanism may also include a spring coupled to the release shaft that urges the release button to a non-depressed position. The latching mechanism may also include a spring coupled to the protruding portion of the trip-latch that urges the trip-latch to protrude from the body. A non-protruding portion of the trip-latch may engage the holding edge.

21 Claims, 6 Drawing Sheets

LATCHING MECHANISM

TECHNICAL FIELD

This application relates to the field of enclosures for electrical components and, more particularly, to the field of securing and removing field replaceable units in enclosures for electrical components.

BACKGROUND OF THE INVENTION

Electrical enclosures are used to house electrical components that provide relatively complex electrical/electronic systems. The electrical enclosures may include brackets that hold circuit boards or similar electronic components in the electrical enclosure and may include connectors that make electrical connections to the circuit boards. The connectors supply power to the circuit boards and allow exchanging data signals with the circuit boards. Thus, a first circuit board in an electrical enclosure may exchange data signals with a second circuit board in the electrical enclosure.

In some cases, the circuit boards or similar components of an electrical enclosure may be provided as field replaceable units that may be removed from and inserted into the electrical enclosure without disrupting other portions of the system in the electrical enclosure. The electrical enclosure may have one or more removeable panels that allow access to the field replaceable units and may have connectors provided on a back plane that frictionally connect with corresponding connectors of the field replaceable units. However, if there are a significant number of connectors, then the amount of force needed to insert and remove the field replaceable units may be considerable. In such a case, latches having levers may be used to properly insert and seat the field replaceable units as well as facilitating removal of the field replaceable units. Generally, the latches may be mounted on each side of a field replaceable unit, either on the electrical enclosure or on the field replaceable unit. A portion of the latches may be rotated in one direction for insertion of the field replaceable units and may be rotated in an opposite direction for removal of the field replaceable units. Rotating a portion of the latches provides lever functionality that applies appropriate force to insert or remove the field replaceable units.

When the latches are released as a first step of removing field replaceable units, it is useful to maintain the latches in a release condition. Thus, for example, a technician that is removing a field replaceable unit would initially actuate the latches (e.g., press a button) that would prevent the latches from locking. The technician could then rotate the latches without the latches inadvertently (and inappropriately) relocking during removal of the field replaceable unit. However, in order to reinsert the field replaceable unit, or insert a new/replacement field replaceable unit, the technician needs to reset the latches to allow the latches to be locked after the insertion. Manually performing the reset is an additional step for the technician which, if not performed, could result in a field replaceable unit not being seated properly.

Accordingly, it is desirable to provide latches for field replaceable units that maintain a release condition when initially actuated for removal of the field replaceable units but which will appropriately reset to facilitate locking the latches upon subsequent insertion.

SUMMARY OF THE INVENTION

According to the system described herein, a latching mechanism includes a body having a trip-latch with a protruding portion that protrudes from the body, a release button coupled to a release shaft disposed inside the body, and a holding edge disposed on the release shaft. The holding edge engages the trip-latch to maintain the release button in a depressed position. The holding edge disengages the trip-latch to place the release button in a non-depressed position in response to urging the protruding portion of the trip latch toward the rotatable body. The latching mechanism may also include a spring coupled to the release shaft that urges the release button to a non-depressed position. The latching mechanism may also include a spring coupled to the protruding portion of the trip-latch that urges the trip-latch to protrude from the body. A non-protruding portion of the trip-latch may engage the holding edge. A pivot point may be provided between the protruding portion of the trip-latch and the non-protruding portion of the trip-latch. The release shaft may include a slope edge opposite to the holding edge that engages the non-protruding portion of the trip-latch. The slope edge may engage the non-protruding portion of the trip-latch to allow the release shaft to move until the holding edge engages the trip-latch to maintain the release button in the depressed position. The release shaft may include a notch that engages a chassis latch pin to maintain the latching mechanism in a locked position. Depressing the release button may disengage the notch from the chassis latch pin to allow movement of the body. The body may rotate to allow insertion, locking, and removal of a field replaceable unit. The field replaceable unit may have a cutout that corresponds to the protruding portion of the trip-latch. Rotating the body may cause the protruding portion of the trip-latch to press against a side of the field replaceable unit to disengage the trip-latch to place the release button in a non-depressed position. The latching mechanism may also include a rigid slide coupled to the body and a grabber coupled to the rigid slide and having a slot that captures a portion of the field replaceable unit, wherein the rigid slide translates rotational motion of the body to rotational motion of the grabber.

According further to the system described herein, operating a latching mechanism includes pressing a release button to unlock a body of the latching mechanism, the release button remaining in a depressed position when no pressure is applied to the release button, and urging a protruding portion of a trip-latch mechanism disposed in the body toward the body to cause the release button to move to a non-pressed position. The protruding portion may be urged toward the body by moving the body to a location that releases a field replaceable unit from an electrical enclosure. A rigid slide coupled to the body may translate rotational motion of the body to rotational motion of a grabber having a slot that captures a portion of the field replaceable unit. A spring may be coupled to the protruding portion of the trip-latch to urge the trip-latch to protrude from the body. A non-protruding portion of the trip-latch may engage a holding edge of a release shaft disposed in the body and coupled to the release button. A pivot point may be provided between the protruding portion of the trip-latch and the non-protruding portion of the trip-latch. The release shaft may include a slope edge opposite to the holding edge that engages the non-protruding portion of the trip-latch.

BRIEF DESCRIPTION OF THE DRAWINGS

Embodiments of the system are described with reference to the several figures of the drawings, noted as follows.

DETAILED DESCRIPTION OF VARIOUS EMBODIMENTS

The system described herein provides a mechanism to automatically reset a latch used for inserting and removing a field replaceable unit. The latch initially maintains a release condition upon being actuated to remove a field replaceable unit. As a portion of the latch is rotated to facilitate removal of the field replaceable unit, a trip-latch mechanism resets the latch to allow the latch to be locked again when a replacement field replaceable unit (or the same unit) is inserted.

Figure 1:
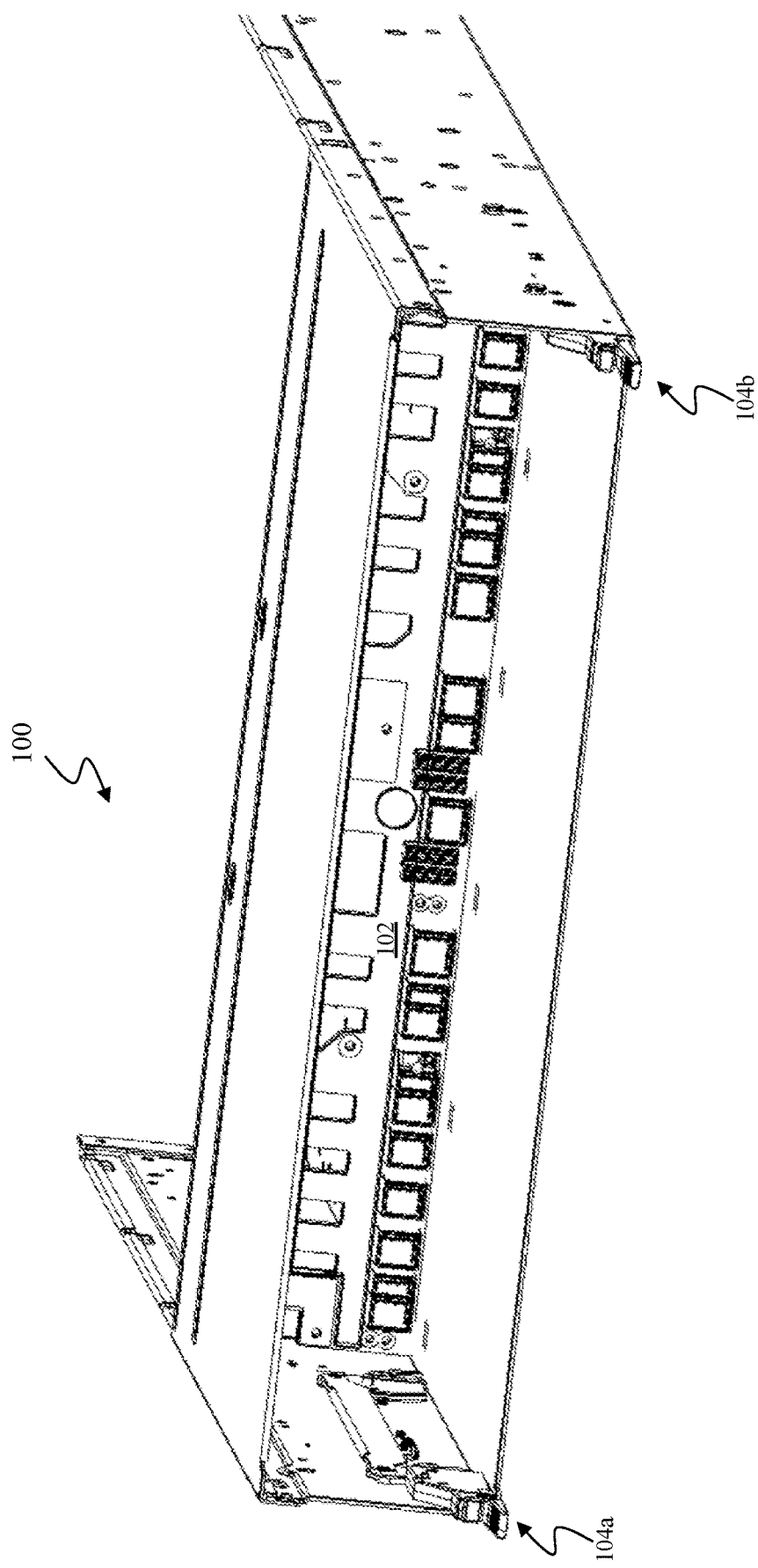
FIG. 1 is schematic diagram illustrating a portion of an electrical enclosure for electrical components having latches for a field replaceable unit according to an embodiment of the system described herein.

FIG. 1 shows a portion 100 of an electrical enclosure for electrical components. The electrical enclosure may contain other portions (not shown), some of which may be identical or similar to the portion 100 and/or some of which may be different from the portion 100. The portion 100 may accept a field replaceable unit (not shown in FIG. 1) containing electrical components that perform a particular function, such as facilitating operation of an array storage device. For example, the electrical enclosure may be an array storage device provided by Dell/EMC of Hopkinton, Mass. and the field replaceable units may include additional controls and/or additional storage for the array storage device. Generally, the field replaceable unit may be a circuit board or any other electrical component that may be inserted into, locked, and removed from the portion 100.

The portion 100 includes a backplane 102 having a plurality of connectors for connecting to components of the field replaceable unit, including pins, holes, slots, and any other type of electrical connector that may be used for connection when the field replaceable unit is slid into the portion 100. Connectors on the field replaceable unit mate with and frictionally engage with connectors on the backplane 102. In some instances, the number of connectors results in significant force being needed to fully engage the field replaceable unit with the portion 100. The portion 100 includes a pair of latch mechanisms 104a, 104b to assist in applying the needed force and, generally, to facilitate insertion and removal of the field replaceable unit, as described in more detail elsewhere herein. The latch mechanisms 104a, 104b provide lever functionality.

Figure 2:
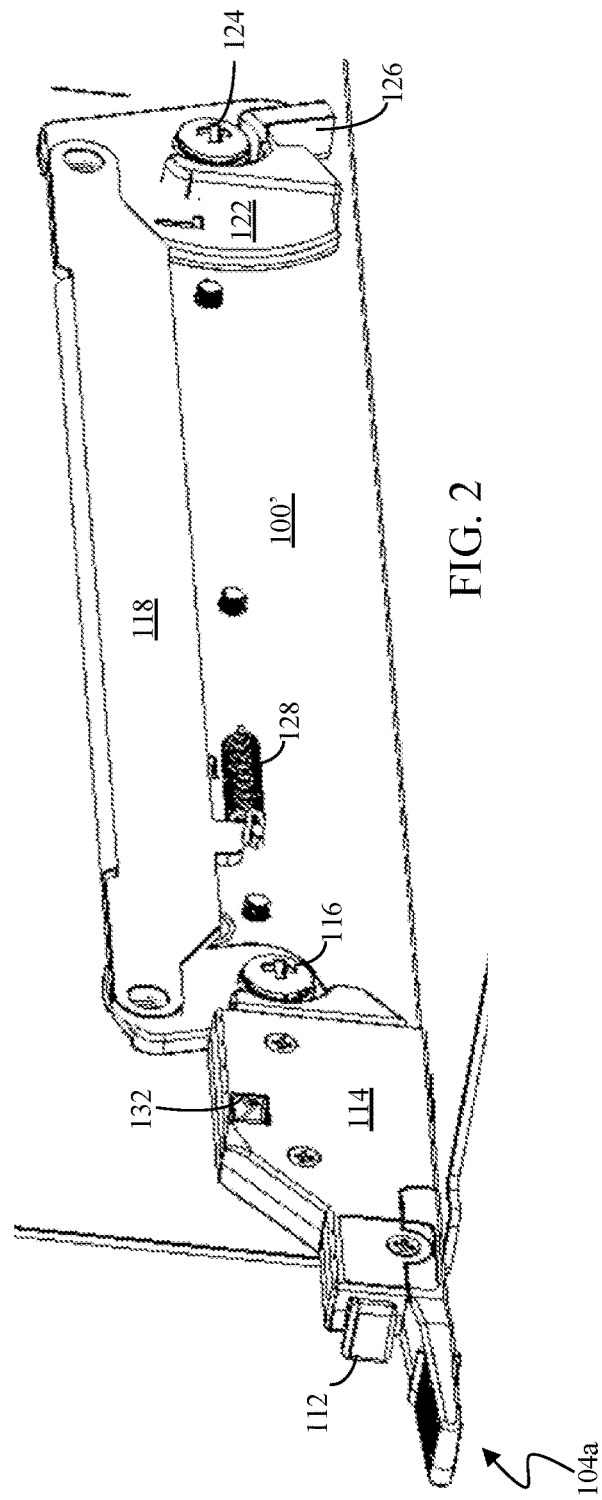
FIG. 2 is a schematic diagram illustrating a latching mechanism for facilitating insertion and removal of a field replaceable unit in an electrical enclosure according to embodiments of the system described herein.

Referring to FIG. 2, the latch mechanism 104a is shown in more detail as including a release button 112 protruding from a latch body 114. In FIG. 2, the latch body 114 is shown in a locked position in which a field replaceable unit (not shown in FIG. 2) is fixedly maintained within the portion in an operational position with all of the connectors fully engaged. The latch body 114 is maintained in the locked position by a chassis latch pin mechanism (not shown in FIG. 2), which is described in more detail elsewhere herein. Depressing the release button 112 disengages the chassis latch pin mechanism to allow the latch body 114 to be rotated clockwise about a first pin 116 that is fixedly attached to the electrical enclosure and protrudes from a section 100' of the portion 100 (not shown in FIG. 2).

Rotating the latch body 114 in a clockwise direction engages a rigid slide 118 to cause an FRU grabber 122 to rotate in a clockwise direction about a second pin 124 that is fixedly attached to the electrical enclosure and protrudes from the section 100' of the portion 100. The FRU grabber 122 includes a slot 126 that engages the field replaceable unit to slide the field replaceable unit in and out of the portion 100. When the grabber 122 rotates clockwise, the field replaceable unit is urged out of the portion 100 and the connectors between the backplane and the field replaceable unit become disengaged. Conversely, when the grabber 122 rotates counterclockwise, the field replaceable unit is urged into the portion 100 and the connectors become engaged. A spring 128 biases the latch mechanism 104a to rotate the grabber 122 clockwise. A trip-latch 132 protrudes from the latch body 114 and is used to reset the chassis latch pin mechanism, as described in more detail elsewhere herein.

A field replaceable unit is removed from the portion 100 by first pressing the release button 112 on the latch mechanism 104a, rotating the latch body 114 clockwise, and then pulling the field replaceable unit out of the portion. Clockwise rotation of the latch body 114 is initiated and facilitated by the spring 128. A field replaceable unit is inserted into the portion 100 by first sliding the field replaceable unit into the portion 100 until the field replaceable unit engages the grabber 122 and then rotating the latch body 114 counterclockwise until the chassis latch pin mechanism engages to lock the field replaceable unit into the portion 100. Note that the other latch mechanism 104b is operated in a similar manner as the latch mechanism 104a in connection with inserting and removing a field replaceable unit.

Figure 3:
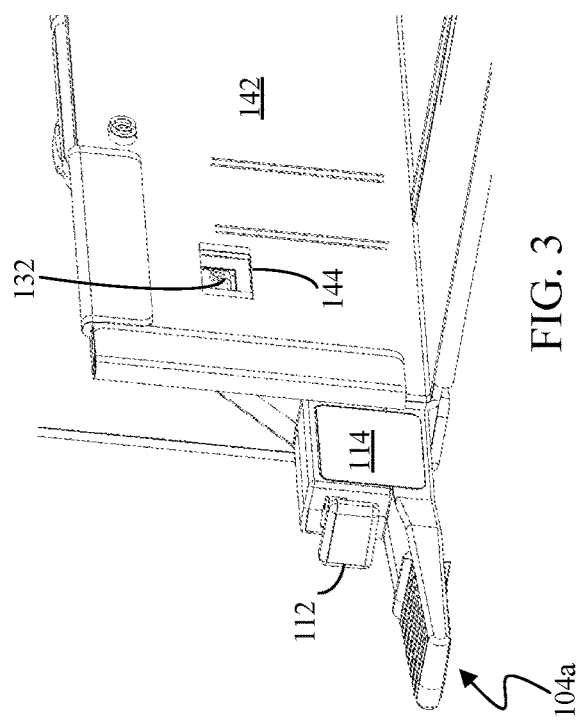
FIG. 3 is a schematic diagram illustrating a trip-latch for a latching mechanism for facilitating insertion and removal of a field replaceable unit in an electrical enclosure according to embodiments of the system described herein.

Referring to FIG. 3, a portion of a field replaceable unit 142 is shown in a fully inserted position with the latch mechanism 104a in a locked position to maintain the field replaceable unit 142 fully inserted. The latch body 114 and a latch body of the other latch mechanisms 104b (not shown in FIG. 3) provide a physical barrier to prevent removal of the field replaceable unit 142. In addition, the grabber 122 of the latch mechanism 104a and the grabber of the other latch mechanism 104b are positioned to maintain the field replaceable unit 142 in an inserted position when the latch mechanisms 104a, 104b are locked.

The field replaceable unit 142 includes a cutout 144 that corresponds to (aligns with) the trip-latch 132. When the release button 112 is pressed and the latch body 114 is rotates clockwise (by the spring 128, not shown in FIG. 3, and by manual force applied to the latch body 114), the trip-latch 132 moves from the cutout 144 to subsequently align with a side of the field replaceable unit 142, thus actuating the trip-latch 132 by pressing the trip-latch 132 into the latch body 114. Actuating the trip-latch 132 resets the chassis latch pin mechanism (not shown in FIG. 3), as described in more detail elsewhere herein.

Figure 4:
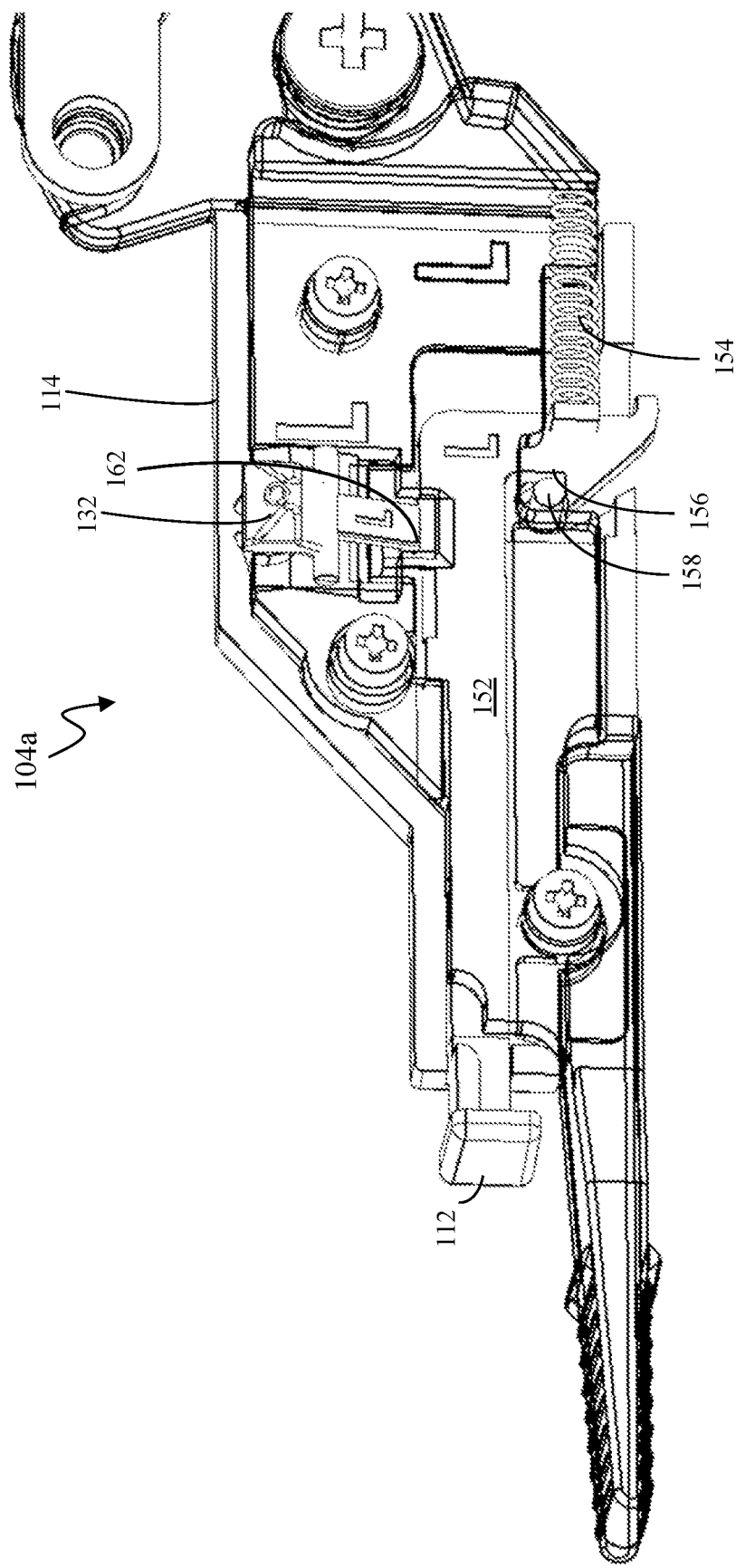
FIG. 4 is a schematic diagram illustrating a release button and a release shaft in a latching mechanism for facilitating insertion and removal of a field replaceable unit in an electrical enclosure according to embodiments of the system described herein.

Referring to FIG. 4, the latch body 114 is shown in more detail with an outer cover thereof removed to illustrate internal components. The release button 112 is coupled to a release shaft 152 that pushes against a spring 154. Thus, the spring 154 urges the release button 112 in a non-depressed position. The release shaft 152 includes a notch 156 that engages a chassis latch pin 158 that is fixedly attached to the electrical enclosure (not shown in FIG. 4). Accordingly, when the notch 156 of the release shaft 152 is engaged with the latch pin 158, the latch body 114 becomes non-rotatable and the latch mechanism 104a prevents the field replaceable unit (not shown in FIG. 4) from moving. When the release button 112 is depressed and the latch body 114 rotates clockwise, the release shaft 152 is no longer engaged with the latch pin 158 and the field replaceable unit may be slid out of the electrical enclosure. The release shaft 152 also includes a holding edge 162 that facilitates maintaining the release button 112 in a depressed position, as described in more detail elsewhere herein.

Figure 5A:
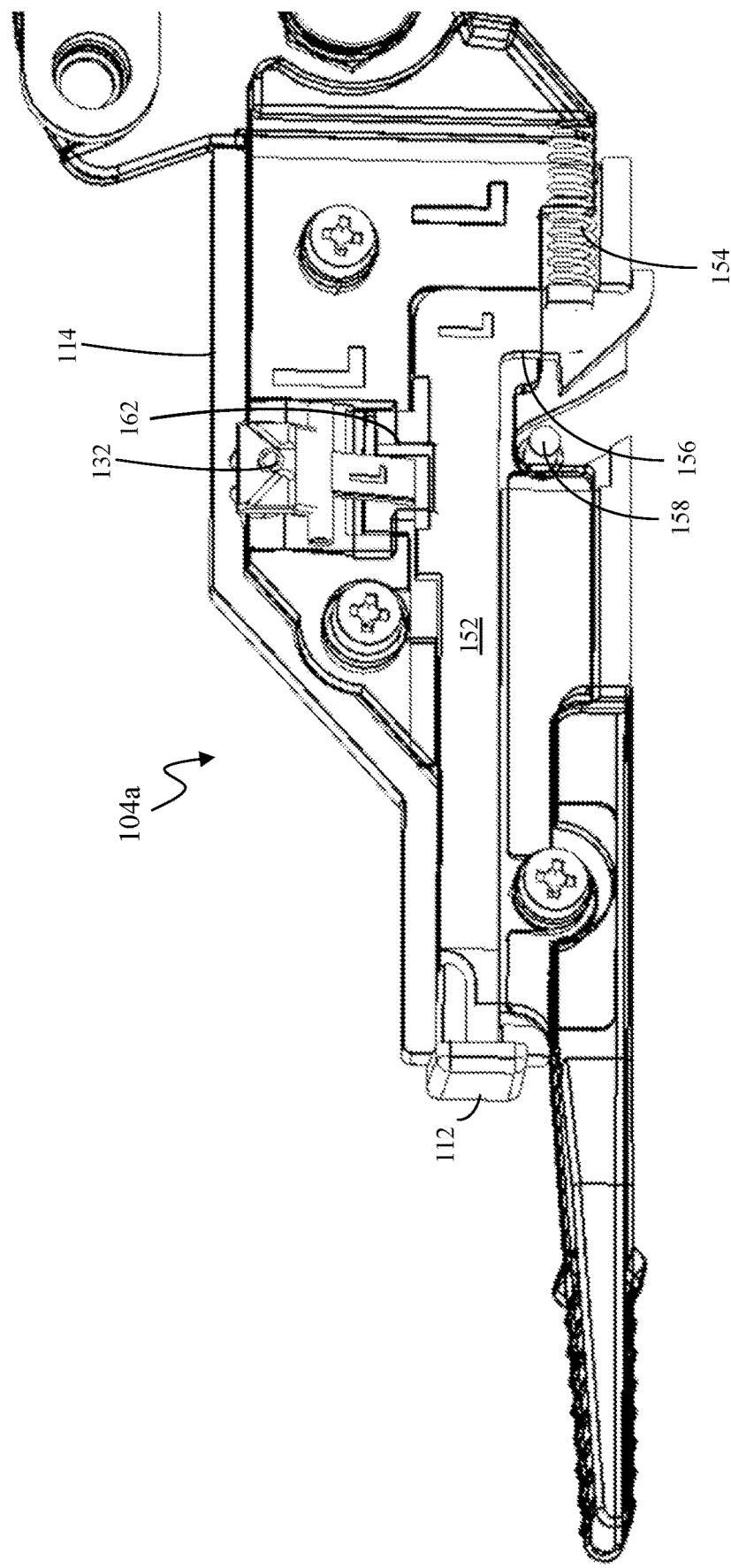
FIGS. 5A and 5B are schematic diagrams illustrating a release button and a release shaft for a latching mechanism in a depressed position for facilitating removal of a field replaceable unit in an electrical enclosure according to embodiments of the system described herein.
Figure 5B:
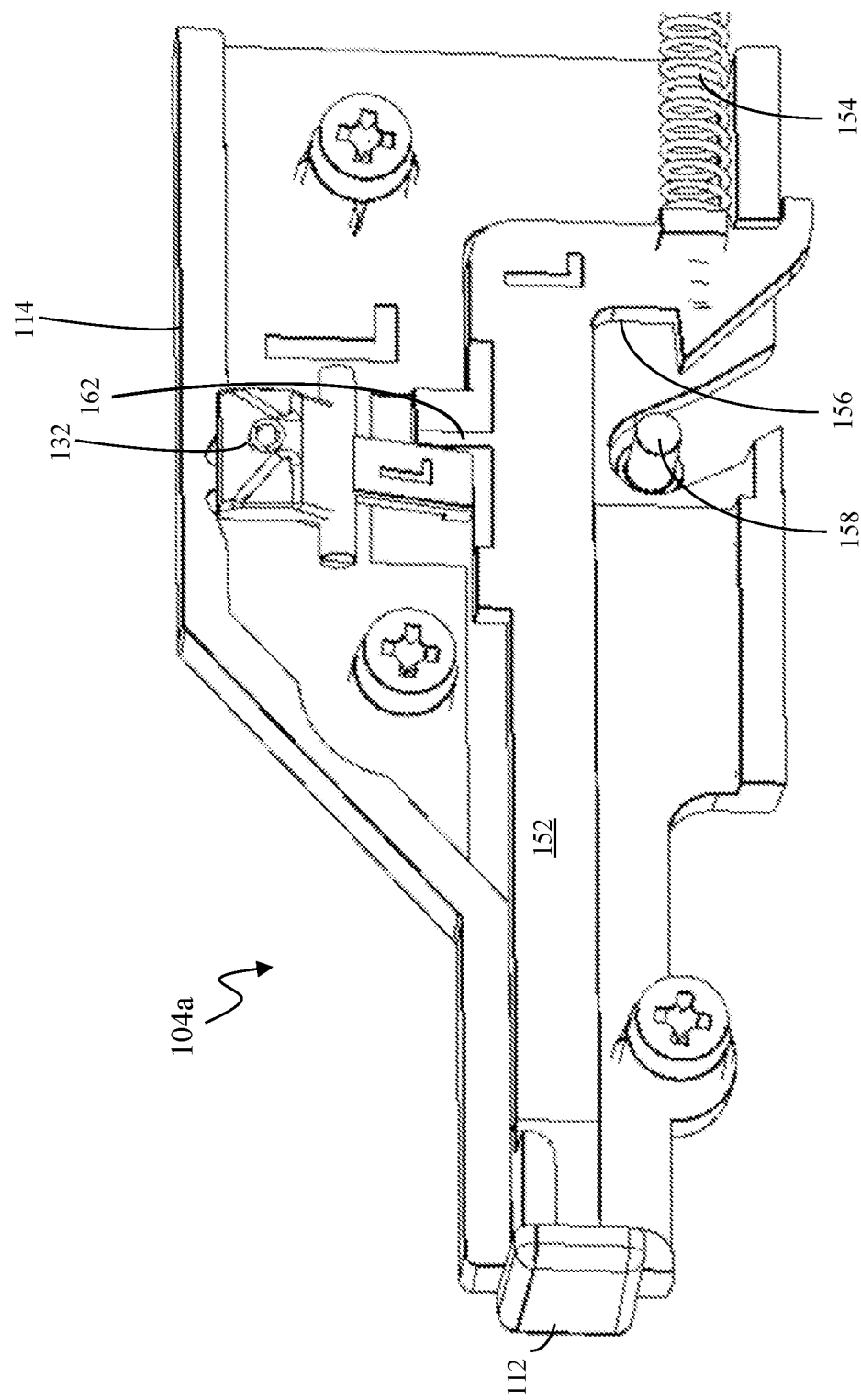

Referring to FIG. 5A, the latch body 114 is shown with the release button 112 maintained in a depressed position. When the release button 112 is depressed, the holding edge 162 engages the trip-latch 132 to cause the release button to be maintained in a position shown in FIG. 5A. The release button 112 stays in a depressed position when the latch body 114 is initially rotated clockwise to allow removal of a field replaceable unit (not shown in FIG. 5A). The release button 112 is returned to a non-depressed position (i.e., the position shown in FIG. 4) by depressing the trip-latch 132 (i.e., urging the trip-latch 132 toward the latch body 114 in a direction that is perpendicular to the latch body 114). This occurs when the trip latch 132 moves away from the cutout 144 (shown in FIG. 3) and is thus depressed by a side of the field replaceable unit 142 (shown in FIG. 3). FIG. 5B shows components of the latch body 114 in a same position as in FIG. 5A with other components eliminated to improve clarity.

Figure 6:
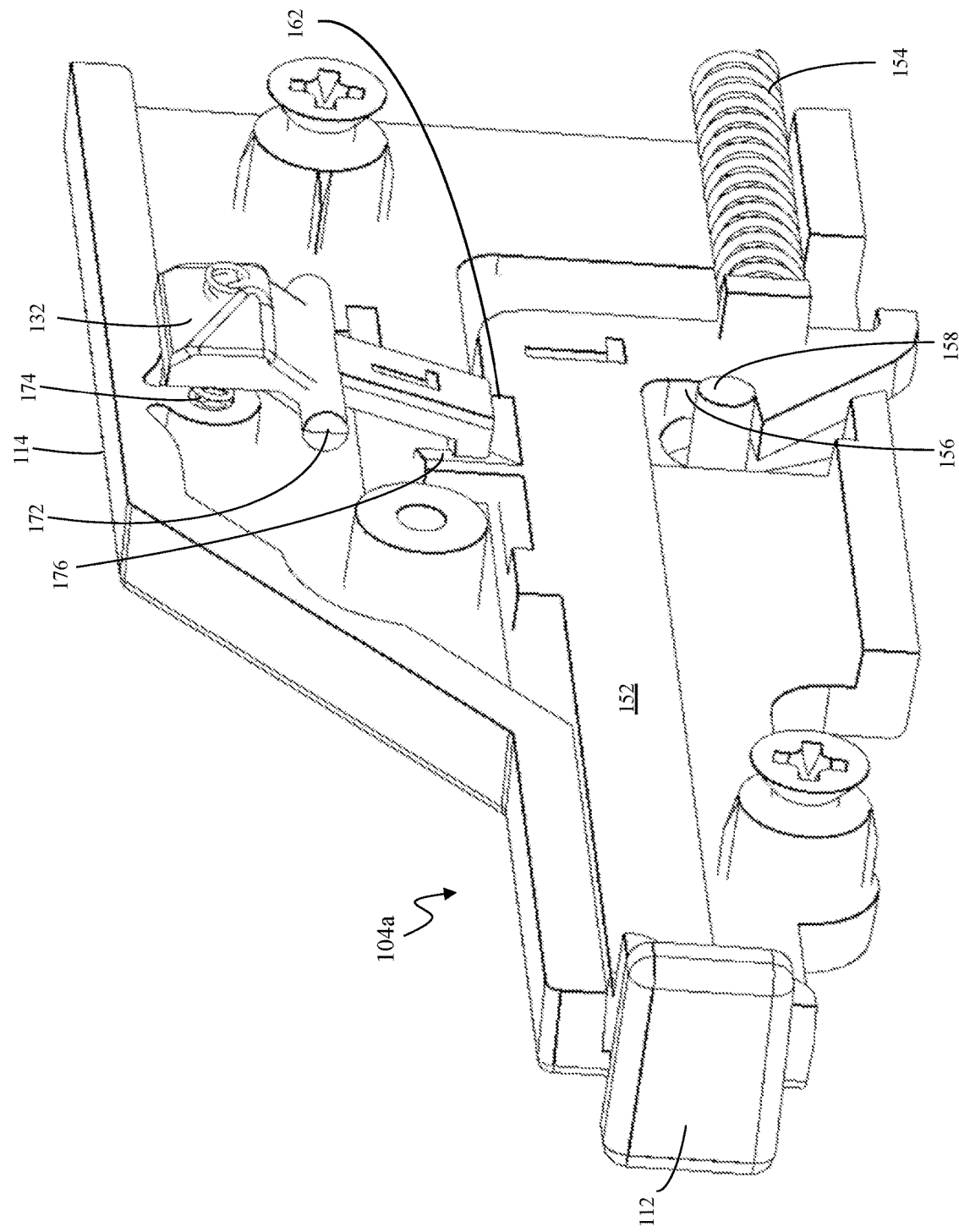
FIG. 6 is a schematic diagram showing in detail a chassis latch pin mechanism in a latching mechanism for facilitating insertion and removal of a field replaceable unit in an electrical enclosure according to embodiments of the system described herein.

Referring to FIG. 6, the latch body 114 is shown with the released button 112 in a non-depressed position similar to the view of FIG. 4, but with additional other components eliminated to improve clarity. The trip-latch 132 is shown in detail as including a pivot point 172 that facilitates the trip-latch 132 moving in a normal direction to the latch body 114. A spring 174 urges a top portion (protruding portion) of the trip latch 132 to protrude from the latch body 114. The release shaft 152 includes a slope edge 176 that is opposite to the holding edge 162. When the release button 112 is depressed, the slope edge 176 engages a non-protruding portion of the trip-latch 132 to allow the release shaft 152 to move until the holding edge 162 engages the trip-latch 132 to hold the release button 112 in a depressed position. When a protruding portion of the trip-latch 132 is urged toward the latch body 114, a non-protruding portion of the trip-latch 132 disengages from the holding edge 162 of the release shaft 152 to allow the spring 154 to move the release shaft 152 and the release button 112 back to a non-depressed position.

Returning to FIG. 3, when the latch mechanism 104a is in a locked state, the release button 112 is in a non-depressed position and the trip-latch 132 protrudes from the cutout 144 of the field replaceable unit 142. When the release button 112 is depressed, the release button 112 initially maintains a depressed state without any pressure provided to the release button 112 because the trip-latch 132 engages the holding edge 162 of the release shaft 152, as described elsewhere herein. When the latch body 114 is rotated clockwise to facilitate removal of the field replaceable unit 142, the trip-latch 132 engages a side of the field replaceable unit 142 to rotate the trip-latch 132 about the pivot point 172 and cause the release button 112 to be in a non-depressed position, as described in more detail elsewhere herein.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A latching mechanism, comprising:
    a body having a trip-latch with a protruding portion that protrudes from the body;
    a release button coupled to a release shaft disposed inside the body; and
    a holding edge disposed on the release shaft, the holding edge engaging the trip-latch to maintain the release button in a depressed position, wherein the holding edge disengages the trip-latch to place the release button in a non-depressed position in response to urging the protruding portion of the trip latch toward the body, wherein a non-protruding portion of the trip-latch engages the holding edge and wherein a pivot point is provided between the protruding portion of the trip-latch and the non-protruding portion of the trip-latch.

2. The latching mechanism, according to claim 1, further comprising:
    a spring coupled to the release shaft that urges the release button to a non-depressed position.

3. The latching mechanism, according to claim 1, further comprising:
    a spring coupled to the protruding portion of the trip-latch that urges the trip-latch to protrude from the body.

4. The latching mechanism, according to claim 1, wherein the release shaft includes a slope edge opposite to the holding edge that engages the non-protruding portion of the trip-latch.

5. The latching mechanism, according to claim 1, wherein the release shaft includes a notch that engages a chassis latch pin to maintain the latching mechanism in a locked position.

6. The latching mechanism, according to claim 1, wherein a non-protruding portion of the trip-latch engages the holding edge and wherein a pivot point is provided between the protruding portion of the trip-latch and the non-protruding portion of the trip-latch.

7. The latching mechanism, according to claim 4, wherein the slope edge engages the non-protruding portion of the trip-latch to allow the release shaft to move until the holding edge engages the trip-latch to maintain the release button in the depressed position.

8. A latching mechanism, comprising:
    a body having a trip-latch with a protruding portion that protrudes from the body;
    a release button coupled to a release shaft disposed inside the body; and
    a holding edge disposed on the release shaft, the holding edge engaging the trip-latch to maintain the release button in a depressed position, wherein the holding edge disengages the trip-latch to place the release button in a non-depressed position in response to urging the protruding portion of the trip latch toward the body, wherein the release shaft includes a notch that engages a chassis latch pin to maintain the latching mechanism in a locked position.

9. The latching mechanism, according to claim 8, wherein depressing the release button disengages the notch from the chassis latch pin to allow movement of the body.

10. The latching mechanism, according to claim 9, wherein the body rotates to allow insertion, locking, and removal of a field replaceable unit.

11. The latching mechanism, according to claim 10, wherein the field replaceable unit has a cutout that corresponds to the protruding portion of the trip-latch.

12. The latching mechanism, according to claim 10, further comprising:
    a rigid slide coupled to the body; and
    a grabber coupled to the rigid slide and having a slot that captures a portion of the field replaceable unit, wherein the rigid slide translates rotational motion of the body to rotational motion of the grabber.

13. The latching mechanism, according to claim 11, wherein rotating the body causes the protruding portion of the trip-latch to press against a side of the field replaceable unit to disengage the trip-latch to place the release button in a non-depressed position.

14. A method of operating a latching mechanism, comprising:
    pressing a release button to unlock a body of the latching mechanism;
    the release button remaining in a depressed position when no pressure is applied to the release button; and
    urging a protruding portion of a trip-latch mechanism disposed in the body toward the body to cause the release button to move to a non-pressed position, wherein a rigid slide coupled to the body translates rotational motion of the body to rotational motion of a grabber having a slot that captures a portion of the field replaceable unit.

15. The method, according to claim 14, wherein the protruding portion is urged toward the body by moving the body to a location that releases a field replaceable unit from an electrical enclosure.

16. The method, according to claim 14, wherein a spring coupled to the protruding portion of the trip-latch urges the trip-latch to protrude from the body.

17. The method, according to claim 14, wherein a non-protruding portion of the trip-latch engages a holding edge of a release shaft disposed in the body and coupled to the release button.

18. The method, according to claim 14, wherein a pivot point is provided between the protruding portion of the trip-latch and the non-protruding portion of the trip-latch.

19. The method, according to claim 17, wherein the release shaft includes a slope edge opposite to the holding edge that engages the non-protruding portion of the trip-latch.

20. A method of operating a latching mechanism, comprising:
    pressing a release button to unlock a body of the latching mechanism;
    the release button remaining in a depressed position when no pressure is applied to the release button; and
    urging a protruding portion of a trip-latch mechanism disposed in the body toward the body to cause the release button to move to a non-pressed position, wherein a non-protruding portion of the trip-latch engages a holding edge of a release shaft disposed in the body and coupled to the release button and wherein a pivot point is provided between the protruding portion of the trip-latch and the non-protruding portion of the trip-latch.

21. The method, according to claim 20, wherein a rigid slide coupled to the body translates rotational motion of the body to rotational motion of a grabber having a slot that captures a portion of the field replaceable unit.

* * * * *